United States Patent
Nicollian et al.

[11] Patent Number: 6,016,062
[45] Date of Patent: Jan. 18, 2000

[54] PROCESS RELATED DAMAGE MONITOR (PREDATOR)—SYSTEMATIC VARIATION OF ANTENNA PARAMETERS TO DETERMINE CHARGE DAMAGE

[75] Inventors: Paul Nicollian, Dallas; Srikanth Krishnan, Richardson, both of Tex.

[73] Assignee: Texas Instruments Incorporated, Dallas, Tex.

[21] Appl. No.: 08/729,477

[22] Filed: Oct. 11, 1996

Related U.S. Application Data

[60] Provisional application No. 60/005,392, Oct. 13, 1995.

[51] Int. Cl.⁷ .................................................. G01R 31/26
[52] U.S. Cl. ............................................................ 324/769
[58] Field of Search ................... 324/769, 765, 324/158.1; 438/14–18

[56] References Cited

U.S. PATENT DOCUMENTS

| | | | |
|---|---|---|---|
| 4,542,340 | 9/1985 | Chakravarti et al. | 324/769 |
| 4,638,341 | 1/1987 | Baier et al. | 324/76.39 |
| 4,672,314 | 6/1987 | Kokkas | 324/765 |
| 4,676,761 | 6/1987 | Poujois | 445/3 |
| 4,767,496 | 8/1988 | Hieber | 438/17 |
| 4,789,825 | 12/1988 | Carelli et al. | 324/765 |
| 4,994,736 | 2/1991 | Davis et al. | 324/765 |
| 5,100,829 | 3/1992 | Fay et al. | 437/60 |
| 5,239,270 | 8/1993 | Desbiens | 324/714 |
| 5,304,925 | 4/1994 | Ebina | 324/769 |
| 5,451,292 | 9/1995 | Shimamune et al. | 216/23 |
| 5,548,224 | 8/1996 | Gabriel et al. | 324/769 |
| 5,598,009 | 1/1997 | Bui | 324/769 |
| 5,661,330 | 8/1997 | Aimi et al. | 257/529 |

*Primary Examiner*—Ernest F. Karlsen
*Attorney, Agent, or Firm*—Mark A. Valetti; Carlton H. Hoel; Richard L. Donaldson

[57] ABSTRACT

One embodiment of the instant invention is a test structure (FIGS. 1, 7 and 8) for determining the effect of various process steps on a plurality of devices with regards to charge-induced damage, the test structure comprising: the plurality of devices (device 10 of FIG. 1 and devices of FIGS. 7 and 8), each of the devices includes a plurality of device levels and device structures; a plurality of antennas (antenna 11 of FIG. 1, antennas of FIGS. 7 and 8) for receiving charged particles emitted during a process step, each of the antennas connected to a corresponding portion of the plurality of devices and wherein the antenna and the corresponding portion of the plurality of devices has a perimeter ratio and an antenna ratio; and wherein the perimeter ratios and the antenna ratios are different for different portions of the plurality of antennas and their corresponding portion of the plurality of devices so that the effect of the various process steps with regards to charge-induced damage can be determined.

10 Claims, 5 Drawing Sheets

PROCESS RELATED DAMAGE MONITOR (PREDATOR)— SYSTEMATIC VARIATION OF ANTENNA PARAMETERS TO DETERMINE CHARGE DAMAGE

This application claims priority under 35 USC § 119(e) (1) provisional application No. 60/005,392, filed Oct. 13, 1995.

CROSS-REFERENCE TO RELATED PATENT/PATENT APPLICATIONS

The following commonly assigned patent/patent applications are hereby incorporated herein by reference: U.S. patent application Ser. No. 08/728,718, filed Oct. 11, 1996.

FIELD OF THE INVENTION

The instant invention pertains to semiconductor device fabrication, processing, and testing and more specifically to the detection of charge-induced damage to semiconductor devices.

BACKGROUND OF THE INVENTION

Process-induced damage is becoming a very serious concern for semiconductor device manufacturer's. Such damage accounts for device degradations and lower yields. One type of process-induced damage is charge-induced damage. Charge-induced damage can occur during plasma etch and plasma-enhanced deposition processes (collectively referred to as plasma charging damage), ash, and ion implantation. Charge-induced damage is becoming particularly important due to: the scaling down of gate oxide thicknesses and channel length with succeeding technologies; increasing levels of metallization; and the advent of high density plasma sources for etching and deposition.

Charge collection in processes that use photoresist (more specifically, non-conductive photoresist) masking, such as etch processes, may occur along the edge of In charge-induced damage, the charge collected in the antenna stresses the oxide of a device. More specifically, in a MOSFET structure, the charge collected on the antenna stresses the gate oxide of the MOSFET, thereby inducing stress-related degradation of the MOSFET. This stress-related degradation may include: shortening the lifetime of the device, increasing the gate leakage of the device, or shifting the threshold voltage of the device.

SUMMARY OF THE INVENTION

The testing and protection scheme of the instant invention (collectively referred to as "PREDATOR") can be utilized to detect (and possibly to reduce) charge-induced damage. Such damage can occur during plasma etch, ash, ion implantation, and plasma-enhanced deposition processes.

One embodiment of the instant invention is a test structure for determining the effect of various process steps on a plurality of devices with regards to charge-induced damage, the test structure comprising: the plurality of devices, each of the devices includes a plurality of device levels and device structures; a plurality of antennas for receiving charged particles emitted during a process step, each of the antennas connected to a corresponding portion of the plurality of devices and wherein the antenna and the corresponding portion of the plurality of devices has a perimeter ratio and an antenna ratio; and wherein the perimeter ratios and the antenna ratios are different for different portions of the plurality of antennas and their corresponding portion of the plurality of devices so that the effect of the various process steps with regards to charge-induced damage can be determined. A portion of the plurality of antennas may be included on different device levels of the plurality of devices, and this portion of the plurality of antennas included on different device levels may be connected in parallel. Different portions of the plurality of antennas can be comprised of different materials. These different materials may include: silicon, polysilicon, silicides, polymers, and metals. In this type of test structure, the most crucial charge-induced effects are the area effect or the edge effect. The area effect is determined by comparing charge-induced damage to devices connected to antennas which have similar perimeter ratios but different antenna ratios, while the edge effect is determined by comparing charge-induced damage to devices connected to antennas which have similar antenna ratios but different perimeter ratios.

Another embodiment of the instant invention is a test structure for determining the effect of various process steps on a plurality of devices with regards to charge-induced damage, the test structure comprising: the plurality of devices, each of the devices includes a plurality of device levels and device structures; a plurality of antennas for receiving charged particles emmitted during a process step, each of the antennas connected to a corresponding portion of the plurality of devices and wherein the antenna and the corresponding portion of the plurality of devices has a perimeter ratio and an antenna ratio; and a plurality of means for selectively disconnecting each of the antennas from its corresponding portion of the plurality of devices so that different portions of the antennas can be disconnected from its corresponding portion of the plurality of devices during different process steps so as to determine the source of charge-induced damage. Preferably, the perimeter ratios and the antenna ratios are different for different portions of the plurality of antennas and their corresponding portion of the plurality of devices so that the effect of the various process steps with regards to charge-induced damage can be determined.

BRIEF DESCRIPTION OF THE DRAWINGS

FIG. 1 illustrates a transistor connected to an "antenna".

FIG. 3 illustrates a fuse.

FIGS. 4a–4c illustrate differential pairs for charge-induced damage detection.

FIGS. 5–5c illustrate a method for detecting the polarity of charge causing damage.

FIGS. 6a–6b illustrate a method for post-metal etch damage detection.

DETAILED DESCRIPTION OF THE DRAWINGS

Figure 1:
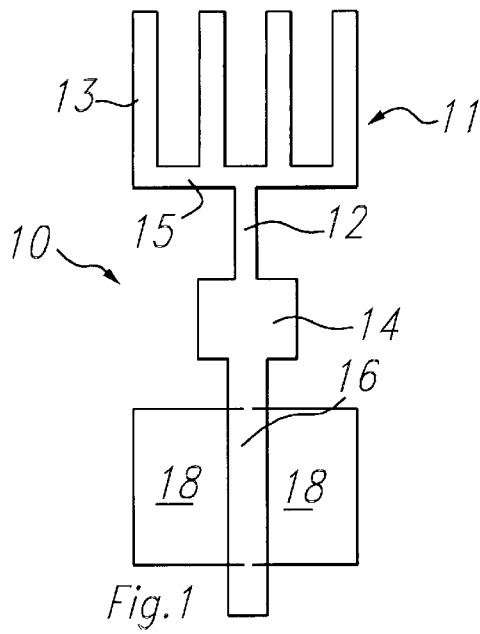
FIG. 1 is plan view of one embodiment of the instant invention.
Figure 3:
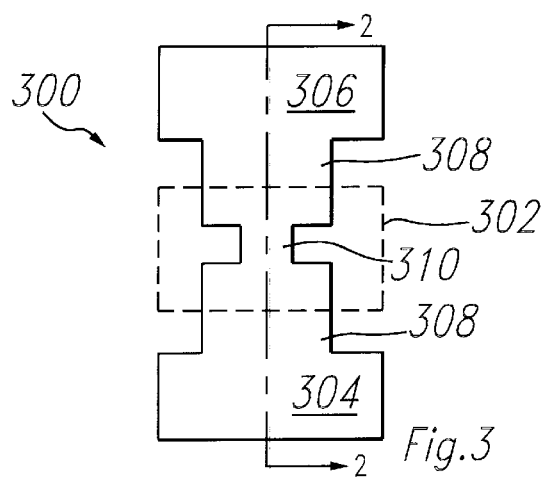
FIG. 3 is a plan view of the second embodiment of the instant invention.
Figure 2:
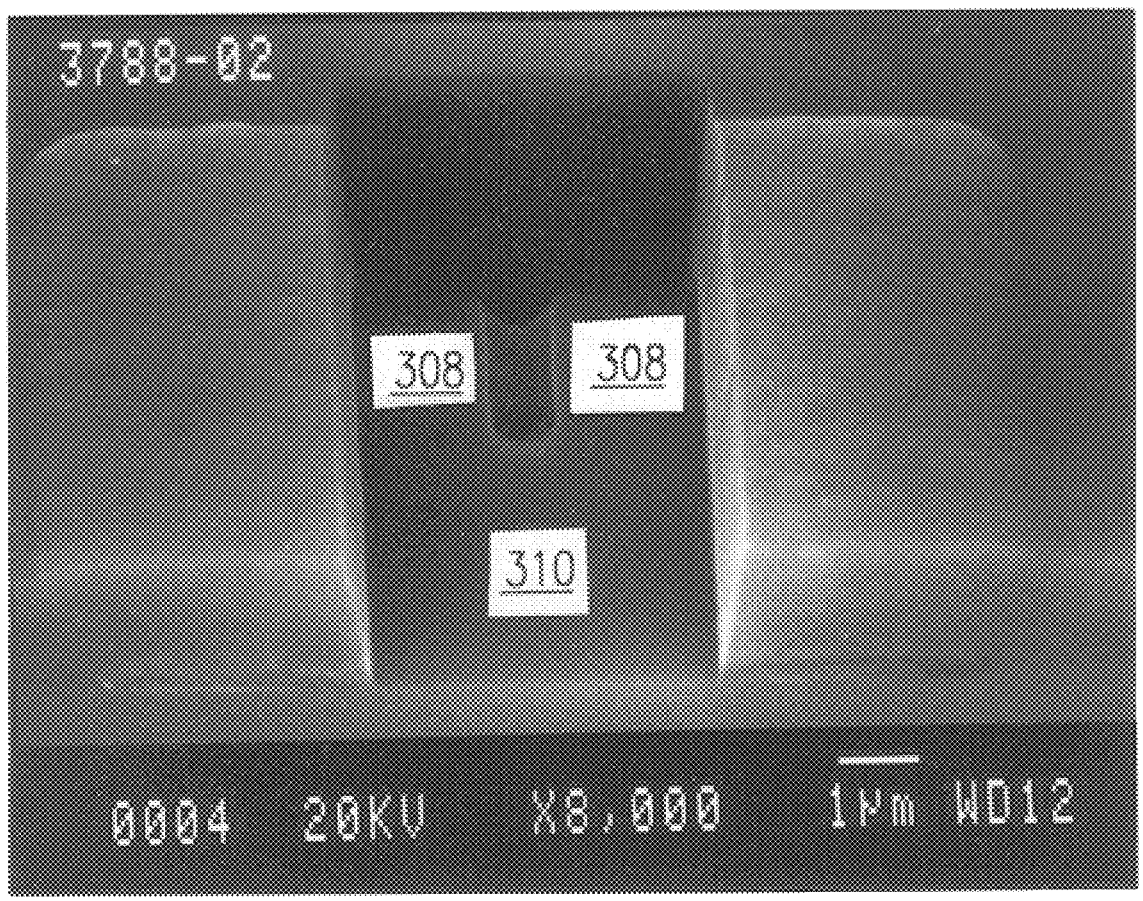
FIG. 2 is an SEM photograph of a second embodiment of the instant invention.

The following description of the several embodiments of the instant invention revolves around FIGS. 1 through 6b. A first embodiment of the instant invention is depicted in FIG. 1. A second embodiment is depicted in FIGS. 2 and 3 and a third embodiment is illustrated in FIGS. 4a through 6b.

FIG. 1 illustrates transistor structure 10 connected to antenna 11. Transistor 10 is comprised of gate region 16 which overlies active region 18. A channel region is preferably situated directly beneath gate region 16. Gate region 16 is connected to pad 14 which is connected to antenna 11 via conductor 12. Conductor 12 may simply be a fuse as is illustrated in FIGS. 2 and 3 such that if the fuse is rendered non-conductive, antenna 11 and pad 14 become electrically isolated from each other. This ability to isolate antenna 11 from transistor 10 becomes significant during the testing of transistor 10 for charge-induced damage because it eliminates the effects of the parasitics of antenna 11 from the measurements of transistor 10. In other words, antenna 11 may be very capacitive and such capacitance would create a problem during the testing of transistor 10. In addition, isolating the antenna from the device helps in desensitizing the device from any subsequent process-induced damage.

The purpose of antenna 11 is to receive charge during a process step. After the charge is received for a given process step or a series of process steps, antenna 11 may be electrically isolated from transistor 10 and transistor 10 may be tested so as to determine the extent of the damage to transistor 10 due to the charging of transistor 10 from the process step or steps.

Figure 7:
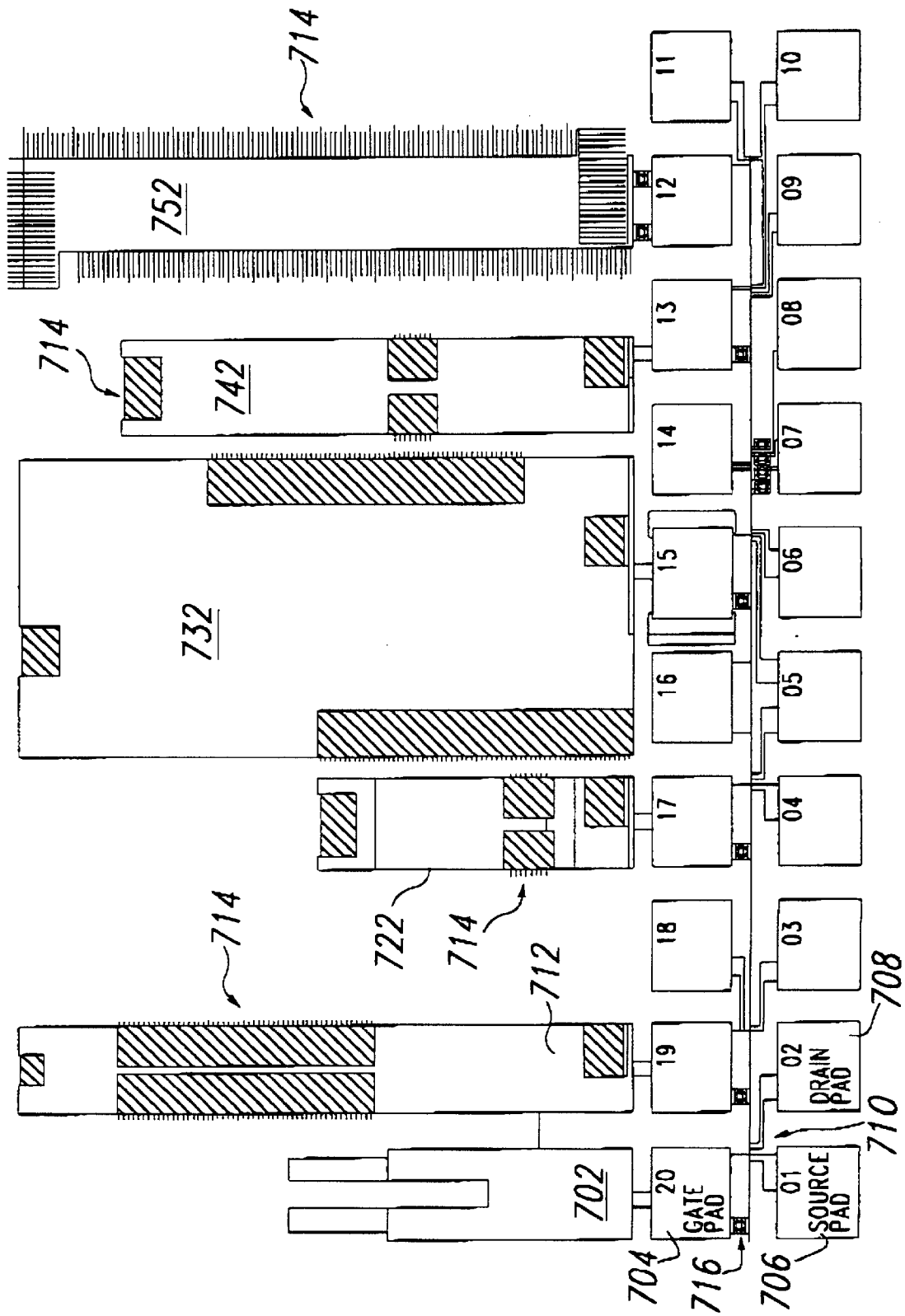
FIGS. 7 and 8 are plan views of two different implementations of the embodiments of the instant invention.
Figure 8:
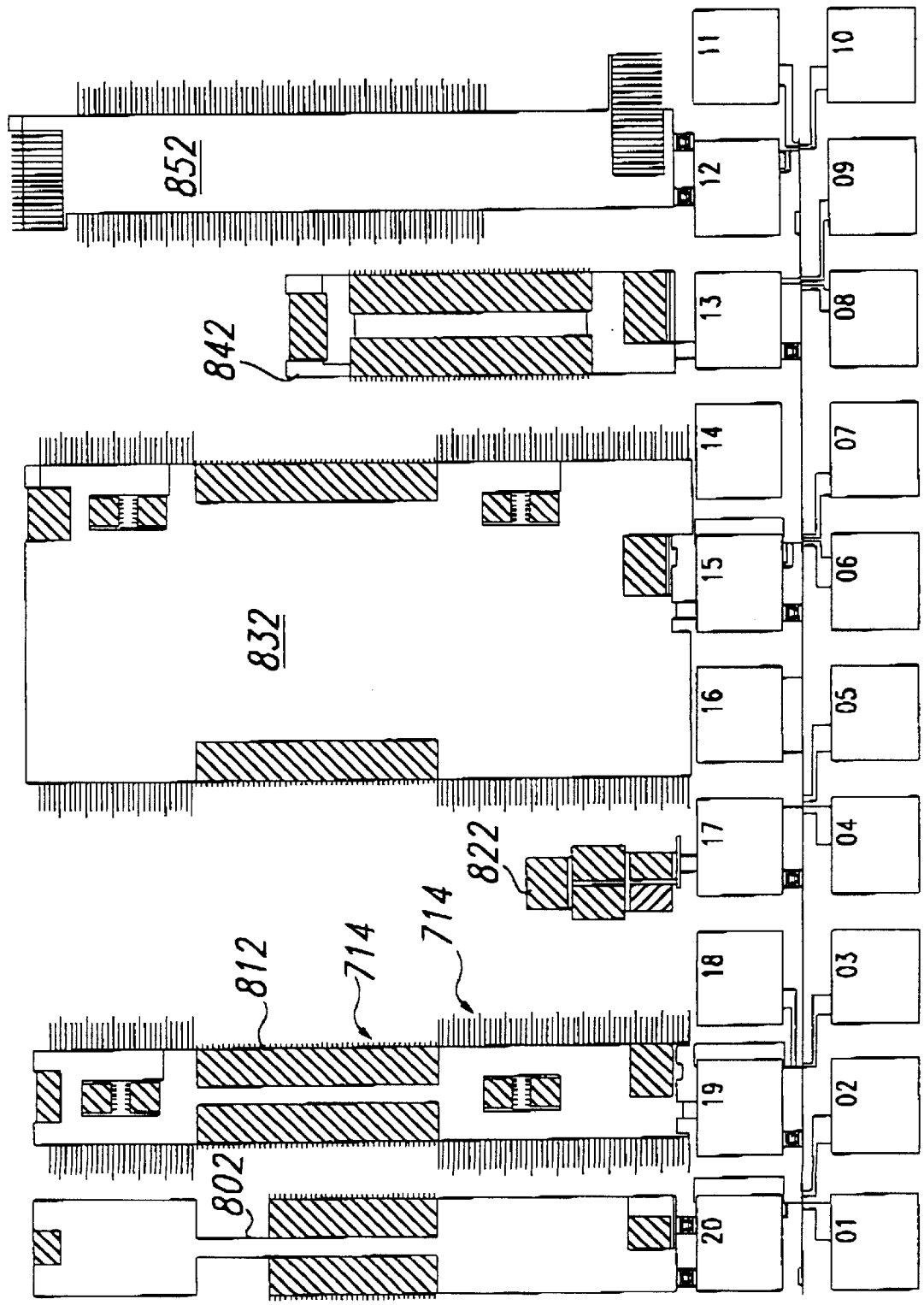

Antenna 11 may be fabricated in any shape. In fact, antenna 11 is illustrated in FIG. 1 with fingers 13 and a body 15. In FIGS. 7 and 8, though, antennas 702, 712, 722, 732, 742 752, 802, 812, 822, 832, 842, and 852 have different shapes. Some of the antennas illustrated in FIGS. 7 and 8 include fingers 714 to increase the perimeter of the antenna. Fingers 714 of FIGS. 7 and 8 are similar to fingers 13 of FIG. 1.

While the shape of the antenna may not be critical, the antenna ratio (which is the ratio of the area of the charge-collecting electrode to the active area of the transistor) and the perimeter ratio (which is the ratio of the perimeter of the antenna to the active area of the transistor) of the antennas are important. As the perimeter of the antenna gets longer the "edge effect" with regards to charging becomes more pronounced, and as the antenna ratio becomes larger the "area effect" becomes more pronounced. Hence, as either or both of these ratio's become large, the amount of charge collection increases and such scaling of the transistor degradation with increasing ratio is proof of charge-induced damage. The antenna ratio of an antenna can be anywhere from 10 to 200,000 and the perimeter of antenna 11 can be from 0.6 $\mu m^{-1}$ to 60,000 $\mu m^{-1}$.

Utilizing an array of active devices connected to antennas (as is shown in FIGS. 7 and 8) in a testing fashion, it is important to systematically vary the antenna ratio while holding the perimeter ratio constant and to systematically vary the perimeter ratio while holding the antenna ratio constant so that the edge effect and the area effect can be systematically derived. As is shown in FIGS. 7 and 8, several antennas have common areas or perimeters: antennas 702, 722, and 842 have a common area, A2; antennas 712, 742, and 812 have a common area, A3; antennas 732 and 832 have a common area, A5; antennas 722, 742, and 822 have a common perimeter, P2; antennas 712, 732 and 842 have a common perimeter, P3; and antennas 812 and 832 have a common perimeter, P4.

The antenna of FIG. 1 is shaped like a fork. This type of configuration allows for an increased perimeter of the antenna without substantially increasing the area of the antenna. In addition, the pitch of the antenna fingers may be varied so as to capture pattern dependent charging effects.

As an example of this, antennas 752 and 852 have the same area and perimeter ratios but the pitch of the fingers of these two antennas is different. More specifically, antenna 752 has fingers at a 3.5 $\mu m$ pitch while antenna 852 has a 2.5 $\mu m$ pitch. Therefore, as was stated above, the shape of antenna 11 can be rectangular, circular, or any other geometric shape.

FIGS. 2 and 3 illustrate a second embodiment of the instant invention. In addition, the second embodiment is also illustrated in FIGS. 7 and 8 as devices 716. The second embodiment of the instant invention is a "fuse" of sorts. The "fuse" of this embodiment is a low resistance element (preferably a substantially zero resistive element) that can be physically altered to become an open circuit (or at least a very highly resistive element). The traditional fuses can accomplish the same function but they require either an electrical impulse or a laser etch to render the fuse to be non-conductive. However the fuse of the instant invention is rendered non-conductive by an etch process.

FIG. 2 is an SEM photo of the second embodiment of the instant invention. The SEM photo of FIG. 2 illustrates regions 308 and 310 of FIG. 3 and was taken along the FIG. 2—FIG. 2 line shown in FIG. 3.

FIG. 3 is a plan view of the second embodiment of the instant invention. This embodiment is basically a circuit element that has either a negligible resistance or a low resistance until it is subjected to an etch process, which renders this circuit element either non-conductive or at least very highly resistive. Circuit element 300 is comprised of pad regions 304 and 306, first step-down regions 308, and second step-down region 310. Preferably, circuit element 300 is fabricated from a conductive material such as silicon, polysilicon, silicide, a polymer (preferably conductive) or a metal. Opening 302 represents an opening in subsequent layers (layers that lay on top of circuit element 300) such that region 310 and at least a portion of regions 308 remain exposed. Opening 302 is important because it allows for the etching away of at least a portion of regions 310 and 308 thereby electrically isolating region 304 from region 306. However, since opening 302 is only a small opening, other circuit elements are minimally affected by such an etch process.

While regions 308 and 310 are referred to as "first step-down region" and "second step-down region", respectively, regions 308 and 310 can have the same width or region 310 can be wider then region 308 or even regions 304/306. In fact, regions 308, 310 and 304/306 can all have the same width. Region 310 is, preferably, stepped-down so that it is more easily removed during the etch process, because if opening 302 is misaligned or the etching process is not properly performed regions 304 and 306 will become isolated unless at least a majority of region 310 is removed.

Regions 304 and 306 can be connected to other circuit elements directly by extending regions 304 and 306 to these other elements (as is discussed above with regards to conductor 12 in FIG. 1). In addition, regions 304 and 306 can be connected to other circuit element by means of contacts or vias. Furthermore, several "fuses" 300 can be connected in parallel. This can be accomplished by having a fuse at sever different device levels and interconnecting these devices by means of contacts or vias.

This type of "fuse" has several advantages over conventional methods. First, many of these circuit elements can be rendered non-conductive or at least highly resistive at one time. This can be accomplished (where the circuit element is fabricated from polysilicon) by using a noncritical oxide etch followed by a polysilicon etch. Second, this type of "fuse" does not require a laser or an electrical pulse to render the "fuse" non-conductive. Conventional methods typically use either lasers or an electrical pulse, which can damage other circuit elements that are also subjected to such energy or could damage other circuit elements by leaving debris behind (thereby resulting in a leakage path). Third, the resistance across the "fuse" can be controlled. This becomes particularly important in applications such as that of FIG. 1 because very low resistances are required. Fourth, there are no restrictions on the number of these types of "fuses" that can be utilized because throughput is not affected by extensive use of this type of "fuse".

As was discussed above, "fuse" 300 can be utilized in the structure of FIG. 1 so as to selectively isolate the antenna from the transistor. In addition, "fuse" 300 can be utilized in other ways. It can be used to protect a circuit element during a process step from charge-induced damage, and later be rendered non-conductive so as not to affect circuit performance. In addition, it can be utilized to protect a circuit element from one process step while not protecting it from another so that the affect of only one process can be studied. In other words, the "fuses" of the instant invention may be made non-conductive at various device levels while keeping other fuses conductive. This can be accomplished by using different masks at these various device levels so as to render some or all of the "fuses" non-conductive. Also note that the "fuses" of the instant invention can be fabricated from virtually any conductive material.

Figure 4A:
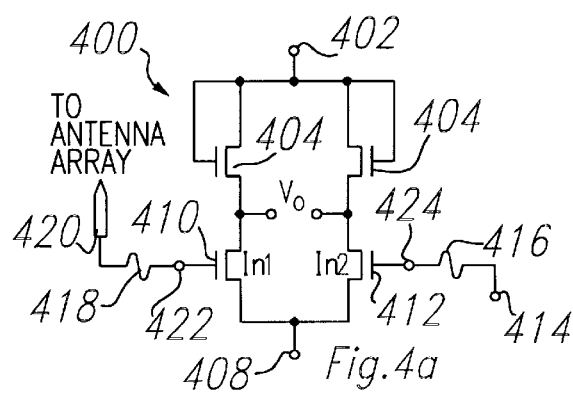
FIGS. 4a–4c are circuit diagrams illustrating a third embodiment of the instant invention.
Figure 4C:
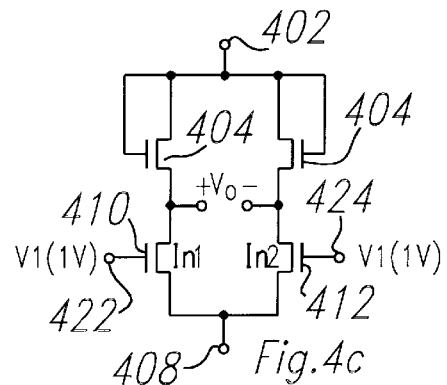
Figure 4B:
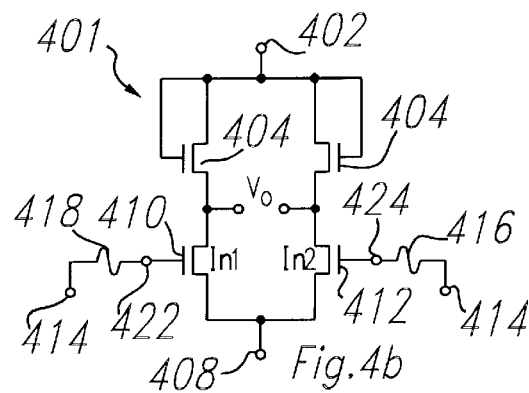

FIGS. 4a–4c illustrate another embodiment of the instant invention. The circuits of FIGS. 4a–4c utilize the antenna from the first embodiment and the "fuse" of the second embodiment. However, these circuits can be utilized to determine the extent of the charge-induced damage that occurs at various process steps. The circuits of FIGS. 4a–4c are differential amplifiers with similarly numbered elements being the same. Supply voltages are applied to nodes 402 and 408, and nodes 414 are preferably connected to the substrate (which is preferably grounded). Transistors 404 provide the appropriate biasing.

The circuit of FIG. 4a is utilized to determine the extent of charge-induced damage that can occur to a transistor (transistor 410). In order to accomplish this, "fuse" 418 remains conductive while the devices are processed. "Fuse" 418 may remain conductive for the entire fabrication of device 400 or it can be rendered non-conductive after one or more process steps, thereby isolating damaged caused to transistor 410 to the charge induced damage occurring in those steps prior to "fuse" 418 being rendered non-conductive. Transistor 410 will become degraded due to the charge-induced damage because of the charges collected on antenna 420 as was described above. Antenna 420 can be of any shape.

Since transistor 412 is connected to the substrate via conductive "fuse" 416, transistor 412 should not become damaged other then typical fabrication defects and the slight charge-induced defects that occur due to the limited exposure of the device. The difference in transistors 410 and 412 resulting from the different exposure to the charges of the process steps will result in a non-zero value for $V_O$. Now referring to FIGS. 4a and 4c, in order to make this measurement, both fuses 418 and 416 are rendered non-conductive and voltages V1 are applied at nodes 422 and 424. Since there will be different electrical characteristics for transistors 410 and 412 due to the different exposure to charge-induced damage, a non-zero voltage will arise at $V_O$. This non-zero $V_O$ value represents the extent to which transistor 410 has been damaged as compared to transistor 412. The greater the value for $V_O$, the greater the difference between transistor 410 and 412.

Now referring to FIGS. 4b and 4c, in order to determine the amount of damage to transistor 410 of FIG. 4a due to charge-induced damage as compared to transistor 412, control circuit 401 is utilized. Control circuit 401 is included on the same wafer as circuit 400, but both transistor 410 and 412 are electrically connected to the substrate in circuit 401. Therefore, both transistor 410 and 412 should be subjected to the same amount of charge-induced damage. Hence, any non-zero value for $V_O$ will be the result of the standard processing defects and not necessarily due to the charge-induced defects. The $V_O$ value of circuit 401 can be compared to that for circuit 400 so as to determine the extent of the $V_O$ value for circuit 400 that can be attributed to charge-induced damage, and, hence, the extent of damage to transistor 410 of FIG. 4a that can be attributed to the charge-induced defects.

The measurement of $V_O$ for circuit 401 can be accomplished by rendering "fuses" 418 and 416 of circuit 401 non-conductive after the fabrication of circuit 401. After the fuses are rendered non-conductive, a voltage, V1, can be applied to terminals 422 and 424 and $V_O$ can be measured.

Figure 5:
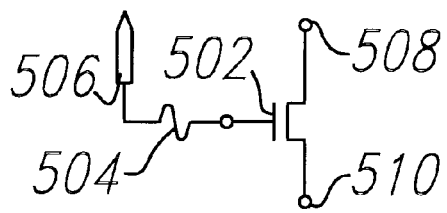
FIGS. 5–5c are circuit diagrams of another embodiment of the instant invention.
Figure 5A:
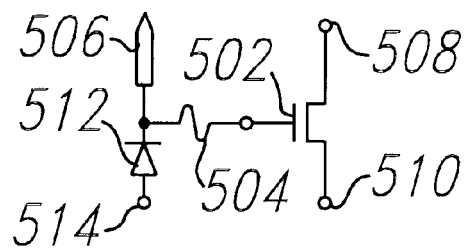
Figure 5C:
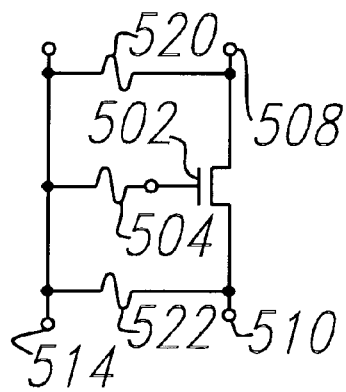

Referring to FIGS. 5–5c, the circuit of FIG. 5 simply illustrates transistor 502 which is subjected to charge-induced damage via antenna 506 and "fuse" 504. "Fuse" 504 can be rendered non-conductive after one, several, or all of the process steps such that the amount of charge-induced damage can be limited to one, several, or all of the "charged" process steps. During testing, supply voltages are applied to terminals 508 and 510. The circuit of FIG. 5c is a control circuit which has fuses 520 and 522 connected between node 524 and the two source/drain regions of transistor 502. Transistor 502 of FIG. 5c should be subjected to minimal charge-induced damage due to the fact that the gate of transistor 502 is tied to the substrate via node 514 and "fuse" 504. The control circuit of FIG. 5c can be compared to the circuits of FIGS. 5–5b so as to determine the extent of charge-induced damage to each of these circuits.

Figure 5B:
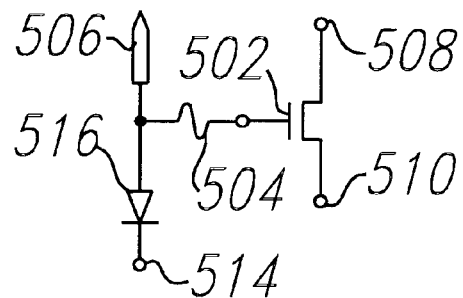

The circuits of FIGS. 5a and 5b are similar to the circuit of FIG. 5 except for the placement of diodes 512 and 516. The circuit of FIG. 5a represents a negative charge shunt while the circuit of FIG. 5b represents a positive charge shunt. In other words, the circuits of FIGS. 5a and 5b can be utilized to determine the polarity of the charges that damage transistor 502. In addition, diodes 512 and 516 may be comprised of a series of diodes so as to increase the reverse bias breakdown voltage. Furthermore, diodes 512 and 516 may be shielded from any in-process illumination and compared to circuits with diodes without such illumination.

As was discussed above, "fuse" 504 can be rendered non-conductive for different reasons. First, it can be rendered non-conductive so as to isolate transistor 502 from antenna 506 so as to greatly reduce the amount of charge damage that transistor 502 is experienced to in subsequent process steps. Second, it can be rendered non-conductive so as to isolate transistor 502 from the parasitics of antenna 506 or node 514 so as to facilitate testing of transistor 502.

Figure 6A:
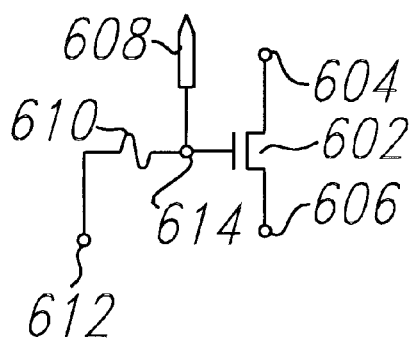
FIGS. 6a–6b are circuit diagrams of another embodiment of the instant invention.
Figure 6B:
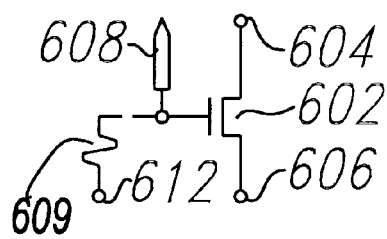

The circuits of FIGS. 6a and 6b represent another embodiment of the instant invention. Circuit 600 is comprised of transistor 602 which has a gate that is connected to antenna 608 and to the substrate (via "fuse" 610). As long as "fuse" 610 remains conductive, transistor 602 of circuit 600 should experience minimal charge-induced damage. However, once "fuse" 610 is rendered non-conductive (as is illustrated by circuit 601 in FIG. 6b), transistor 602 will be subjected to the charges collected by antenna 608. The ability to protect transistor 602 (as is done in circuit 600) and then to allow transistor 602 to be subjected to charge-induced damage after one or more process steps facilitates in determining the extent to which devices are damaged in subsequent process steps, such as post-metal etch. In addition, a "fuse" may be placed between node 614 and antenna 608 such that "fuse" 610 may be rendered non-conductive (resulting in subjecting transistor 602 to charge-induced damage) after one or more process steps and then rendering the "fuse" between node 614 and antenna 608 non-conductive thereby reducing the amount of charging of transistor 602 so that the amount of charging damage can be determined for middle level process steps. Total elimination of the effects of any further processing is possible by the addition of fuse 609 following the middle level process steps. During testing, supply voltages are applied to terminals 604, 606, and 612.

FIGS. 7 and 8 illustrate different test devices which utilize the different embodiments of the instant invention. Several "fuses" 716 are utilized in these devices so as to either protect the devices or selectively isolate a particular device from its antenna. In addition, several antennas are illustrated with different areas and perimeters. Several of the antennas have fingers 714 which may vary with regards to the length and width of the finger and spacing between the fingers.

Although specific embodiments of the present invention are herein described, they are not to be construed as limiting the scope of the invention. Many embodiments of the present invention will become apparent to those skilled in the art in light of methodology of the specification. The scope of the invention is limited only by the claims appended.

What we claim is:

1. A test structure for determining the effect of various process steps on a plurality of devices with regards to charge-induced damage, said test structure comprising:

said plurality of devices, each of said devices includes a plurality of device levels and device structures;

a plurality of antennas for receiving charged particles emitted during a process step, each of said antennas connected to a corresponding portion of said plurality of devices and wherein said antenna and said corresponding portion of said plurality of devices has a perimeter ratio and an antenna ratio; and wherein said perimeter ratios and said antenna ratios are substantially different for different portions of said plurality of antennas and their corresponding portion of said plurality of devices so that the effect of said various process steps with regards to charge-induced damage can be determined.

2. The test structure of claim 1, wherein a portion of said plurality of antennas is included on different device levels of said plurality of devices.

3. The test structure of claim 2, wherein said portion of said plurality of antennas included on different device levels are connected in parallel.

4. The test structure of claim 1, wherein different portions of said plurality of antennas are comprised of different materials.

5. The test structure of claim 4, wherein said different materials are selected from the group consisting of: silicon, polysilicon, silicides, polymers, and metals.

6. The test structure of claim 1 wherein said effect of said various process steps with regards to charge-induced damage is either the area effect or the edge effect.

7. The test structure of claim 6 wherein said area effect is determined by comparing charge-induced damage to devices connected to antennas which have similar perimeter ratios but different antenna ratios.

8. The test structure of claim 6 wherein said edge effect is determined by comparing charge-induced damage to devices connected to antennas which have similar antenna ratios but different perimeter ratios.

9. A test structure for determining the effect of various process steps on a plurality of devices with regards to charge-induced damage, said test structure comprising:

said plurality of devices, each of said devices includes a plurality of device levels and device structures;

a plurality of antennas for receiving charged particles emmitted during a process step, each of said antennas connected to a corresponding portion of said plurality of devices and wherein said antenna and said corresponding portion of said plurality of devices has a perimeter ratio and an antenna ratio;

a plurality of means for selectively disconnecting each of said antennas from its said corresponding portion of said plurality of devices so that different portions of said antennas can be disconnected from its corresponding portion of said plurality of devices during different process steps so as to determine the source of charge-induced damage;

and wherein said perimeter ratios and said antenna ratios are substantially different for different portions of said plurality of antennas and their corresponding portion or said plurality of devices so that the effect of said various process steps with regards to charge-induced damage can be determined.

10. The test structure of claim 6, wherein said perimeter ratios and said antenna ratios are different for different portions of said plurality of antennas and their corresponding portion of said plurality of devices so that the effect of said various process steps with regards to charge-induced damage can be determined.

* * * * *